US012453235B2

United States Patent
Zhang

(10) Patent No.: US 12,453,235 B2
(45) Date of Patent: Oct. 21, 2025

(54) LIGHT-EMITTING DIODE COMPRISING COMPOSITE FILM BETWEEN ELECTRON TRANSPORT LAYER AND CATHODE AND PREPARATION METHOD THEREOF

(71) Applicant: TCL TECHNOLOGY GROUP CORPORATION, Guangdong (CN)

(72) Inventor: Tianshuo Zhang, Guangdong (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 503 days.

(21) Appl. No.: 17/935,701

(22) Filed: Sep. 27, 2022

(65) Prior Publication Data

US 2023/0038312 A1 Feb. 9, 2023

Related U.S. Application Data

(63) Continuation of application No. PCT/CN2021/140130, filed on Dec. 21, 2021.

(30) Foreign Application Priority Data

Dec. 24, 2020 (CN) .......................... 202011548093.3

(51) Int. Cl.
*H10K 50/16* (2023.01)
*H10K 50/115* (2023.01)
(Continued)

(52) U.S. Cl.
CPC ........... *H10K 50/16* (2023.02); *H10K 50/115* (2023.02); *H10K 50/171* (2023.02); *H10K 71/00* (2023.02); *H10K 71/40* (2023.02); *H10K 2102/00* (2023.02)

(58) Field of Classification Search
None
See application file for complete search history.

(56) References Cited

U.S. PATENT DOCUMENTS

2004/0207312 A1* 10/2004 Takashima ............. C09K 11/06
313/503
2011/0121722 A1 5/2011 Takashima et al.
(Continued)

FOREIGN PATENT DOCUMENTS

| CN | 106463639 A | 2/2017 |
| CN | 206116461 U | 4/2017 |

(Continued)

*Primary Examiner* — Daniel Whalen

(57) ABSTRACT

A light-emitting diode and a preparation method of the light-emitting diode are provided in the present application. The light-emitting diode includes an anode and a cathode which are arranged opposite to each other, a luminescent layer arranged between the anode and the cathode, an electron transport layer arranged between the cathode and the luminescent layer, and a composite film arranged between the cathode and the electron transport layer. Where the composite film includes an aluminum oxide film arranged adjacent to the electron transport layer, and a nano metal oxide film or a silicon nitride film arranged away from the electron transport layer. The light-emitting diode according to the present application may block water and oxygen from infiltrating into it effectively, so that a poor stability of the light-emitting diode device in a water-oxygen environment is improved.

14 Claims, 2 Drawing Sheets

(51) Int. Cl.
    *H10K 50/17*     (2023.01)
    *H10K 71/00*     (2023.01)
    *H10K 71/40*     (2023.01)
    *H10K 102/00*     (2023.01)

(56) References Cited

U.S. PATENT DOCUMENTS

2012/0292652 A1* 11/2012 Yamae ................. H10K 50/856
                                                                                                    257/98
2019/0131557 A1* 5/2019 Lee ....................... H10K 50/166

FOREIGN PATENT DOCUMENTS

| CN | 107910449 A | 4/2018 |
| CN | 108735905 A | 11/2018 |
| CN | 109713098 A | 5/2019 |
| CN | 110112302 A | 8/2019 |

\* cited by examiner

LIGHT-EMITTING DIODE COMPRISING COMPOSITE FILM BETWEEN ELECTRON TRANSPORT LAYER AND CATHODE AND PREPARATION METHOD THEREOF

CROSS-REFERENCE TO RELATED APPLICATIONS

This application is a continuation application of PCT patent application Serial No. PCT/CN2021/140130, filed on Dec. 21, 2021, which claims priority to Chinese patent application No. 202011548093.3 filed on Dec. 24, 2020 and entitled "light-emitting diode and preparation method thereof", the entire contents of which are incorporated herein by reference.

BACKGROUND

1. Technical Field

The present application relates to the technical field of photoelectronic devices, and more particularly to a light-emitting diode and a preparation method thereof.

2. Related Art

Quantum dot is one kind of nanometer material composed of a small number of atoms, generally, a radius of a quantum dot is smaller than or equivalent to a Bohr radius of an exciton, the quantum dot reflects a significant quantum confinement effect, and has unique optical properties such as continuously adjustable luminescent spectrum due to the material's size and components, narrow half-peak width, high fluorescence efficiency, long lifetime, excellent monodispersity and high optothermal stability, and the like. The quantum dot is widely used in the fields such as displaying, illumination, biomarkers and solar cells due to these unique properties.

Quantum dot electroluminescent is a new solid-state illumination technology, has the beneficial effects of low cost, light weight, high response speed, and high color saturation, has a broad development prospect, and has become one of the important research directions of the new generation of LED (light-emitting diode) illumination. The existing QLED (Quantum Dot light-emitting diode) mainly includes a cathode, an anode, and a quantum dot luminescent layer. In order to improve the performance of the QLED device, on this basis, a functional layer such as a hole transport layer, an electron transport layer, and an electron injection layer is introduced into the QLED. In an operation process of the QLED device, the poor stability of electrical properties of the QLED device in water-oxygen environment (especially high relative humidity being greater than 75%) is always a difficult problem that cannot be solved.

SUMMARY

One objective of the embodiments of the present application is to provide a light-emitting diode and a method for preparing the light-emitting diode.

The technical solutions involved in the embodiments of the present application are as follows:

In the first aspect, a light-emitting diode is provided, the light-emitting diode includes: an anode and a cathode which are arranged opposite to each other, a luminescent layer arranged between the anode and the cathode, an electron transport layer arranged between the cathode and the luminescent layer, and a composite film arranged between the cathode and the electron transport layer. The composite film includes an aluminum oxide film arranged adjacent to the electron transport layer, and a nano metal oxide film or a silicon nitride film arranged away from the electron transport layer.

In some embodiments, a material of the nano metal oxide film includes at least one of $TiO_2$, $ZrO_2$, and $SiO_2$.

In some embodiments, a thickness of the composite film is less than or equal to 25 nm.

In some embodiments, the thickness of the composite film is between 15 nm and 25 nm.

In some embodiments, when the composite film includes the nano metal oxide film, a thickness ratio of the aluminum oxide film to the nano metal oxide film is between 3:1 and 1:3.

In some embodiments, a thickness ratio of the aluminum oxide film to the nano metal oxide film is one of 1:3, 1:2, 1:1, 2:1 and 3:1.

In some embodiments, a thickness ratio of the aluminum oxide film to the silicon nitride film is between 3:1 and 1:3.

In some embodiments, a thickness ratio of the aluminum oxide film to the silicon nitride film is one of 1:3, 1:2, 1:1, 2:1 and 3:1.

In some embodiments, the light-emitting diode further includes a hole functional layer arranged between the anode and the luminescent layer.

In some embodiments, the hole functional layer includes at least one of a hole injection layer, a hole transmission layer and a hole barrier layer.

In some embodiments, the light-emitting diode has a non-inverted architecture, the light-emitting diode further comprises a substrate and the anode is arranged on the substrate.

In some embodiments, the luminescent layer is a quantum dot luminescent layer or an organic luminescent layer.

In the second aspect, a method for preparing a light-emitting diode is provided, this method includes following steps of:

at step S01, providing a prefabricated member, where the prefabricated member includes an anode substrate, and a luminescent layer arranged on an anode surface of the anode substrate;

at step S02, coating an electron transport material on a surface of the luminescent layer being away from the anode substrate, and performing an annealing treatment on the electron transport material to prepare an electron transport layer;

at step S03, coating an aluminum oxide film on a surface of the electron transport layer being away from the luminescent layer, and coating a nano metal oxide film or a silicon nitride film on a surface of the aluminum oxide film being away from the electron transport layer to form a composite film; and at step S04, preparing a cathode on a surface of the composite film being away from the electron transport layer to form the light-emitting diode.

In some embodiments, an annealing temperature for the annealing treatment is between 30° C. and 120° C.

In some embodiments, the annealing temperature for the annealing treatment is between 30° C. and 50° C.

The beneficial effects of the light-emitting diode according to the embodiments of the present application are described as follows: the composite film is arranged between the cathode and the electron transport layer of the light-emitting diode and is served as a transition layer; the aluminum oxide film and the nano metal oxide film are selected to form the composite film, or the aluminum oxide film and the silicon nitride film are selected to form the composite film in the transition layer, so that the stability of the LED device in the water-oxygen environment is improved.

In particular, firstly, the aluminum oxide, the nano metal oxide material and the silicon nitride themselves have excellent air barrier properties after the film is formed, and have excellent thermal stability, so that a good anti-aging effect can still be realized between the electron transport layer and the electrode in an environment with unfriendly relative humidity and temperature, and the overall stability of the LED device is improved. Moreover, these materials have relatively higher optical transmittance, and would not affect illumination of the light-emitting diode device seriously and thereby causes attenuation of optical property of the light-emitting diode device. It should be noted that a pure aluminum oxide film has a bad chemical stability due to irregularity of crystallization of film formation, and thus has a poor air barrier property in an environment of high relative humidity being greater than 75%. Due to this reason, a composite film is applied in the present application, the nano metal oxide film is introduced, so that a problem of poor chemical stability due to irregularity of crystallization of film formation of the aluminum oxide film is avoided. According to the synergistic effect of the aluminum oxide film and the nano metal oxide film, the stability of the light-emitting diode, especially the stability of the light-emitting diode under high-humidity (relative humidity being greater than 75%) environment, is effectively improved.

Secondly, according to the present application, the aluminum oxide film having a conduction band of 3.2 eV is arranged adjacent to the electron transport layer, and the nano metal oxide film or the silicon nitride film is arranged adjacent to the cathode, so that energy levels of the electron transport layer—the aluminum oxide film—the nano metal oxide film or the energy levels of the silicon nitride film—cathode can be better matched, and a serious influence of the arrangement of the composite film on the injection of carriers is avoided. Therefore, the LED device may have better stability, and especially have excellent stability in the water-oxygen environment while maintaining excellent electrical properties, due to the arrangement of the composite film.

Thirdly, the aluminum oxide, the nano metal oxide material and the silicon nitride have excellent deposition adhesion properties when they are deposited on the various electron transport materials and cathode materials, so that the film formed by the aluminum oxide, the nano metal oxide material and the silicon nitride is provided with excellent properties. The aluminum oxide, the nano metal oxide material and the silicon nitride are suitable for various electron transport layer substrates or cathode substrates, and a problem that the electrical properties of the LED device is weakened due to poor quality of the formed film will be avoided.

The method for preparing the light-emitting diode according to the present application has the following beneficial effects: according to this method, it only needs to arrange the composite film formed by the aluminum oxide film and the nano metal oxide film or prepare the composite film formed by the aluminum oxide film and the silicon nitride film between the electron transport layer and the cathode, and enable the aluminum oxide film to be arranged adjacent to the electron transport layer based on the conventional preparation method of light-emitting diode. This method is simple in operation and is mature in process, and has a broad application prospect.

BRIEF DESCRIPTION OF THE DRAWINGS

In order to describe the embodiments of the present application more clearly, a brief introduction regarding the accompanying drawings that need to be used for describing the embodiments of the present application or the prior art is given below; it is apparent that the accompanying drawings described below are merely some embodiments of the present application, a person of ordinary skill in the art may also acquire other drawings according to the current drawings without paying creative labor.

DETAILED DESCRIPTION OF EMBODIMENTS

Figure 1:
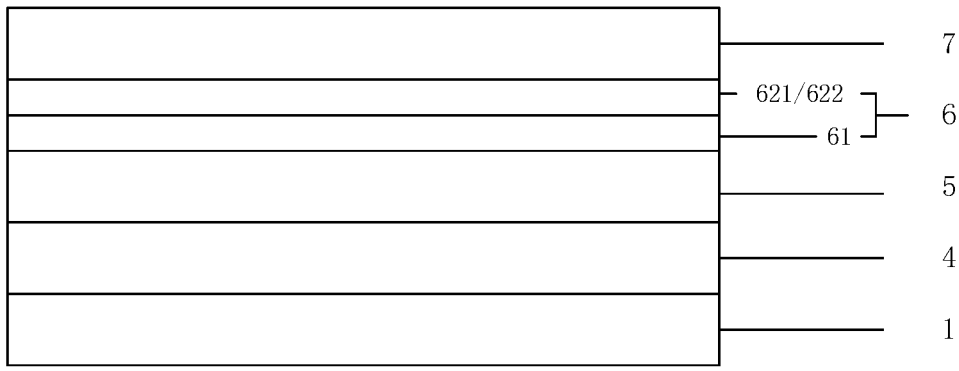
FIG. 1 illustrates a schematic structural diagram of a light-emitting diode provided by one embodiment of the present application.
Figure 2:
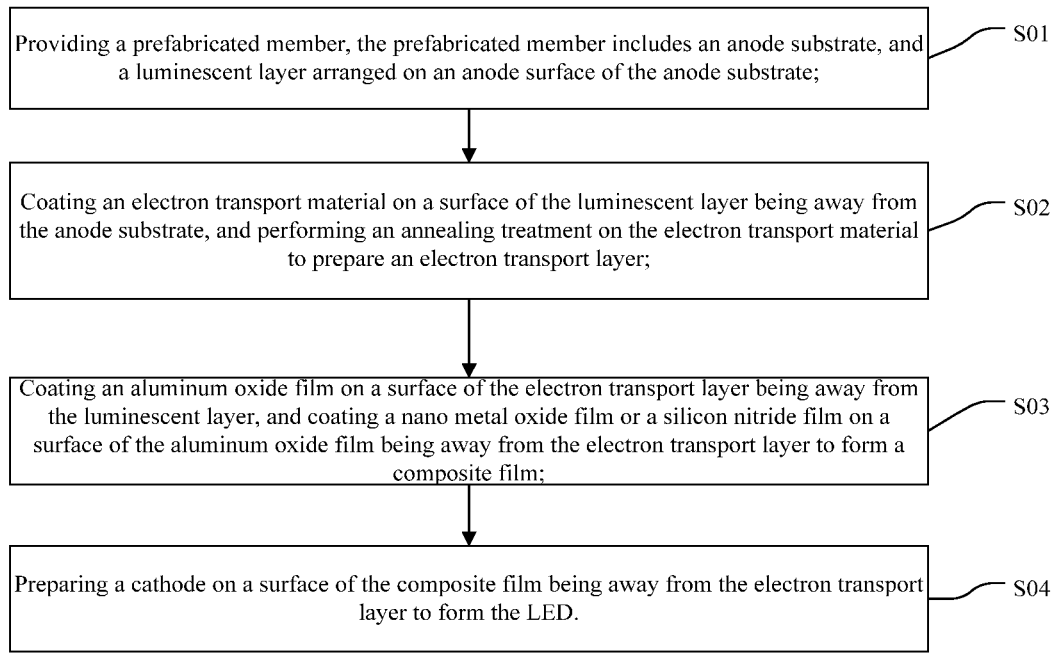
FIG. 2 illustrates a flowchart of a preparation process of the light-emitting diode provided by one embodiment of the present application.

In order to make the technical problems, the technical solutions and the beneficial effects of the present application be clearer and more understandable, the present application will be further described in detail below with reference to the embodiments. It should be understood that the embodiments described herein are only intended to illustrate but not to limit the present application.

In the claims and detailed description of embodiments of the present application, the term "and/or" is used to describe an association relationship of an associated object, represents that there may be three relationships, for example, A and/or B may represent three conditions: A exists alone, A and B coexist, B exists alone. A and B may be singular or plural. The character "/" generally indicates that there is a relationship of "or" between two successive associated objects.

In the present application, "at least one" refers to one or a plurality of, and "a plurality of" refers to two or more than two. "At least one of the following items (numbers)" or similar expression refers to any combination of these items (numbers), including any combination of a single item (number) or multiple items (numbers). For example, "at least one of a, b or c", or "at least one of a, b, and c" may represent a, b, c, a-b (i.e., a and b), a-c, b-c, or a-b-c, where a, b, and c may be singular or plural.

It should be understood that, in various embodiments of the present application, the values of serial numbers of the steps in the processes do not indicate an order of execution sequences of the steps, some or all steps may be executed in parallel or in sequence; the execution sequences of these steps should be determined by functionalities and internal logic of these steps, and shouldn't be regarded as limitation to an implementation process of the embodiment of the present application.

The terminologies used in the embodiments of the present application are merely for the purpose of describing particular embodiments and are not intended to limit the present application. The terms "a", "the" and "said" in the singular form and used in the embodiments of the present application and the annexed claims can also be in a plural form as well, unless there is a clearly indication of these terms in the context otherwise.

The terms "first" and "second" are only used for descriptive purposes and are used to distinguish objects such as substances, interfaces, messages, requests and terminals from one another, and cannot be interpreted as indicating or implying relative importance or implicitly indicating the number of indicated technical features. For example, the first XX may also be referred to as the second XX without departing from the scope of the embodiments of the present application. Similarly, the second XX may also be referred to as the first XX. Thus, features described with "first" or "second" may explicitly or implicitly include one or a plurality of the features.

During operation of a QLED (Quantum Dot Light Emitting Diode) device, the stability of the electrical properties of the QLED device in environment (especially high relative humidity being greater than 75%) is always a difficult problem that cannot be solved. In particular, after water molecules in the environment infiltrate into the QLED device, the water molecules generates a certain positive aging effect on an interface layer between an electron transport layer and an electrode layer. Although the electrical properties and the service lifetime of the QLED device are improved in a short period of time, the QLED device quickly enters an attenuation period due to the water molecules that infiltrate into the QLED, and the aging of the QLED device causes an increasing of leakage current and greatly attenuated service lifetime. This aging phenomenon may be caused due to certain oxidation effects of water and oxygen infiltrated into the QLED device on the interface layer between the cathode and the electron transport layer, or due to attaching or coordination between the water and a defective position on a surface of the electron transport layer material. This phenomenon is more evident when an ambient relative humidity is greater than 75%. In view of this, a new light-emitting diode and a method for preparing the light-emitting diode are provided in the present application.

In the first aspect, with reference to FIG. 1, an LED (Light Emitting Diode) is provided in one embodiment of the present application, the LED includes an anode 1 and a cathode 7 which are arranged opposite to each other, a luminescent layer 4 arranged between the anode 1 and the cathode 7, an electron transport layer 5 arranged between the cathode 7 and the luminescent layer 4, and a composite film 6 arranged between the cathode 7 and the electron transport layer 5. The composite film 6 includes an aluminum oxide film 61 arranged adjacent to the electron transport layer, and a nano metal oxide film 621 or a silicon nitride film 622 arranged away from the electron transport layer 5.

According to the light-emitting diode provided in the embodiments of the present application, the composite film 6 is arranged between the cathode and the electron transport layer of the light-emitting diode and serves as a transition layer, the aluminum oxide film 61 and the nano metal oxide film 621 are selected to form the composite film 6, or the aluminum oxide film 61 and the silicon nitride film 622 are selected to form the composite film 6 in the transition layer, so that the stability of the LED in water-oxygen environment is improved.

Firstly, the aluminum oxide, the nano metal oxide material and the silicon nitride themselves have excellent air barrier properties after the film is formed, and have excellent thermal stability, so that a good anti-aging effect can still be achieved between the electron transport layer and the electrode in an environment with unfriendly relative humidity and temperature, and the overall stability of the LED device is improved. Moreover, these materials have relatively higher light transmissivity, and would not affect illumination of the LED device seriously and thereby causes attenuation of optical properties of the LED device. It should be noted that a pure aluminum oxide film has a poor chemical stability due to irregularity of crystallization of film formation, and thus has a poor air barrier property in an environment of high humidity (relative humidity being greater than 75%). Due to this reason, a composite film 6 is applied in the present application, the nano metal oxide film 62 is introduced, so that a problem of poor chemical stability due to irregularity of crystallization of film formation of the aluminum oxide film 61 is avoided. According to the synergistic effect of the aluminum oxide film 61 and the nano metal oxide film 621 or the silicon nitride film 622, the stability of the light-emitting diode, and especially the stability of the light-emitting diode under high-humidity (relative humidity being greater than 75%) environment, is effectively improved.

Secondly, according to the present application, the aluminum oxide film 61 having a conduction band of 3.2 eV is arranged adjacent to the electron transport layer 5, and the nano metal oxide film 621 or the silicon nitride film 622 is arranged adjacent to the cathode 7, so that energy levels of the electron transport layer 5—the aluminum oxide film 61—the nano metal oxide film 621 or the energy levels of the silicon nitride film 622—cathode 7 can be better matched, and a serious influence of the arrangement of the composite film 6 on the injection of carriers is avoided. Therefore, the LED device may have better stability and especially have excellent stability in water-oxygen environment while maintaining excellent electrical properties, due to the arrangement of the composite film 6.

Thirdly, the aluminum oxide, the nano metal oxide material and the silicon nitride have good deposition adhesion on various electron transport materials and cathode materials, so that the film formed by the aluminum oxide, the nano metal oxide material and the silicon nitride is provided with excellent performance, the aluminum oxide, the nano metal oxide material and the silicon nitride are suitable for various electron transport layer substrates or cathode substrates, and a problem that the electrical properties of the LED device is weakened due to poor quality of the formed film will be avoided.

In this embodiment of the present application, the composite film 6 is arranged at an interface of the cathode 7 and the electron transport layer 5, and is used to improve a negative influence of external water and oxygen on the packaged LED. In particular, the composite film 6 formed by the aluminum oxide film 61 and the nano metal oxide film 621 or the composite film 6 formed by the aluminum oxide film 61 and the silicon nitride film 622 are used to improve environmental stability of the packaged light-emitting diode, and especially improve the stability of the packaged light-emitting diode under a high relative humidity (relative humidity being greater than 75%) environment.

The aluminum oxide itself is not provided with an electron transmitting function, but has good air barrier property, especially water-oxygen barrier property and good film formation adhesion. The aluminum oxide conduction band is served as the transition layer material, and is matched with the electron transport layer and the electrode, so that the transmission of carriers is not significantly affected while the environmental stability of the light-emitting diode is improved by introducing the aluminum oxide film 61. The aluminum oxide film 61 is individually arranged between the cathode 7 and the electron transport layer 5, so that an efficiency of active aging of the light-emitting diode is accelerated. In the active aging process of the LED, although a luminescent efficiency of the LED device can be improved, the luminescent efficiency of the LED device is unstable due to too fast active aging speed, the LED device enters an attenuation period quickly, and finally, it is not conducive to obtain the LED with better stability.

In this embodiment of the present application, a nano metal oxide in the nano metal oxide film 621 and a silicon nitride in the silicon nitride film 622 have a certain water-oxygen barrier property. In one preferable embodiment, the material of the nano metal oxide film 621 includes at least one of $TiO_2$, $ZrO_2$, and $SiO_2$. In this condition, the formed nano metal oxide film 621 can not only have excellent air barrier property and thermal stability, but also improve crystallization of film formation of the aluminum oxide film 61, and improve the air barrier property of the aluminum oxide film 61, especially the water-oxygen barrier property, such that the LED can still have a good anti-aging effect between the electron transport layer 5 and the cathode 7 in the environment with unfriendly relative humidity and temperature, thereby improving the overall stability of the LED device.

In some embodiments, the thickness of the composite film 6 is less than or equal to 25 nm. If the composite film 6 is too thick, a transmission efficiency of the carriers is affected, and the electrical properties of the LED device is reduced. In some embodiments, the thickness of the composite film 6 is between 15 nm and 25 nm. In this condition, the composite film 6 has a suitable thickness, so that the composite film 6 can not only have an effective air barrier property, but also does not significantly influence the transmission efficiency of the carriers. For example, the thickness of the composite film 6 is one of 15 nm, 16 nm, 17 nm, 18 nm, 19 nm, 20 nm, 21 nm, 22 nm, 23 nm, 24 nm, and 25 nm.

In some embodiments, the thickness ratio of the aluminum oxide film 61 to the nano metal oxide film 621 in the composite film 6 is between 3:1 and 1:3. In some embodiments, the thickness ratio of the aluminum oxide film 61 to the silicon nitride film 622 in the composite film 6 is between 3:1 and 1:3. In this condition, the thickness of the aluminum oxide film 61 takes a proportion of 25%-75% of the total thickness of the composite film 6, so that the air barrier property, and especially the water-oxygen barrier effect is achieved, the crystallization of film formation of the aluminum oxide film 61 is improved according to the remaining thickness of the nano metal oxide film 621 or the silicon nitride film 622, and the air barrier property (especially the water-oxygen barrier effect) of the aluminum oxide film 61 is improved. In addition, the nano metal oxide film 621 or the silicon nitride film 622 introduced into the light-emitting diode has a certain thickness and also has an air barrier property, so that the air barrier property (especially the water-oxygen barrier effect) of the light-emitting diode can be further improved. If the aluminum oxide film 61 is too thick, the crystallization of film formation of the aluminum oxide film 61 is irregular, and the chemical stability is poor, the air barrier effect of the aluminum oxide film 61 may be affected. If the nano metal oxide film 621 or the silicon nitride film 622 is too thick, the electrical transmission performance of the composite film 6 is affected, and finally the overall brightness of the light-emitting diode device may be reduced. In some embodiments, the thickness ratio of the aluminum oxide film 61 to the nano metal oxide film 62 in the composite film 6 is one of 1:3, 1:2, 1:1, 2:1, 3:1. However, the thickness ratio is not limited thereto. In some embodiments, the thickness ratio of the aluminum oxide film 61 to the silicon nitride film 622 in the composite film 6 is one of 1:3, 1:2, 1:1, 2:1, 3:1. However, the thickness ratio is not limited thereto.

In some embodiments, the thickness of the composite film 6 is less than or equal to 25 nm, and the thickness ratio of the aluminum oxide film 61 to the nano metal oxide film 621 is between 3:1 and 1:3. In some embodiments, the thickness of the composite film 6 is less than or equal to 25 nm, and the thickness ratio of the aluminum oxide film 61 to the silicon nitride film 622 is between 3:1 and 1:3. For example, the thickness ratio of the aluminum oxide film 61 to the nano metal oxide film 621 is one of 1:1, 1:2, 1:1, 2:1, 3:1. For example, the thickness ratio of the aluminum oxide film 61 to the silicon nitride film 621 is one of 1:3, 1:2, 1:1, 2:1, 3:1. In some embodiments, the thickness of the composite film 6 is 20 nm, the aluminum oxide film 61 and the nano metal oxide film 621 have a thickness of 10 nm. In some embodiments, the thickness of the composite film 6 is 20 nm, the aluminum oxide film 61 and the silicon nitride film 622 have a thickness of 10 nm.

In some embodiments, the light-emitting diode further includes a hole functional layer arranged between the anode 1 and the luminescent layer 3. The hole functional layer includes at least one of a hole injection layer, a hole transport layer, and a hole barrier layer.

In this embodiment of the present application, the LED may further include a substrate, the anode 1 or the cathode 7 is arranged on the substrate. The LED according to the embodiments of the present application is classified into a light-emitting diode having an non-inverted architecture and a light-emitting diode having an inverted architecture.

In one embodiment, the light-emitting diode having the non-inverted architecture includes an anode 1 and a cathode 7 which are arranged opposite to each other, a luminescent layer 4 arranged between the anode 1 and the cathode 7, an electron transport layer 5 arranged between the cathode 7 and the luminescent layer 4, and a composite film 6 arranged between the cathode 7 and the electron transport layer 5. Where the composite film 6 includes an aluminum oxide film 61 arranged adjacent to the electron transport layer 5 and a nano metal oxide film 62 arranged away from the electron transport layer 5, and the anode 1 is arranged on the substrate. Furthermore, a hole functional layer such as a hole transport layer, a hole injection layer, and an electron barrier layer may be arranged between the anode 1 and the luminescent layer 4. When the LED is the one having the non-inverted architecture, the stability of the LED under the water-oxygen environment can be improved by arranging the composite film 6; moreover, by regulating the annealing treatment temperature of the electron transport layer 5 (in this condition, the preparation of the anode 1 and the luminescent layer 4 has been completed), such that the aging of the electron transport material occurs in a low-water-oxygen environment, and the stability of the light-emitting diode is improved accordingly. In some embodiments, the level of aging of the electron transport material is controlled at a suitable level as the annealing temperature of the electron transport layer 5 is controlled between 30° C. and 50° C., excessive oxidation of the interface between the electron transport layer 5 and the cathode 7 interface may be avoided or delayed, and the oxidation level of the interface between the electron transport layer 5 and the cathode 7 may be reduced. Thus, the service lifetime of the light-emitting diode is improved. On this basis, higher external quantum efficiency is ensured.

Figure 3:
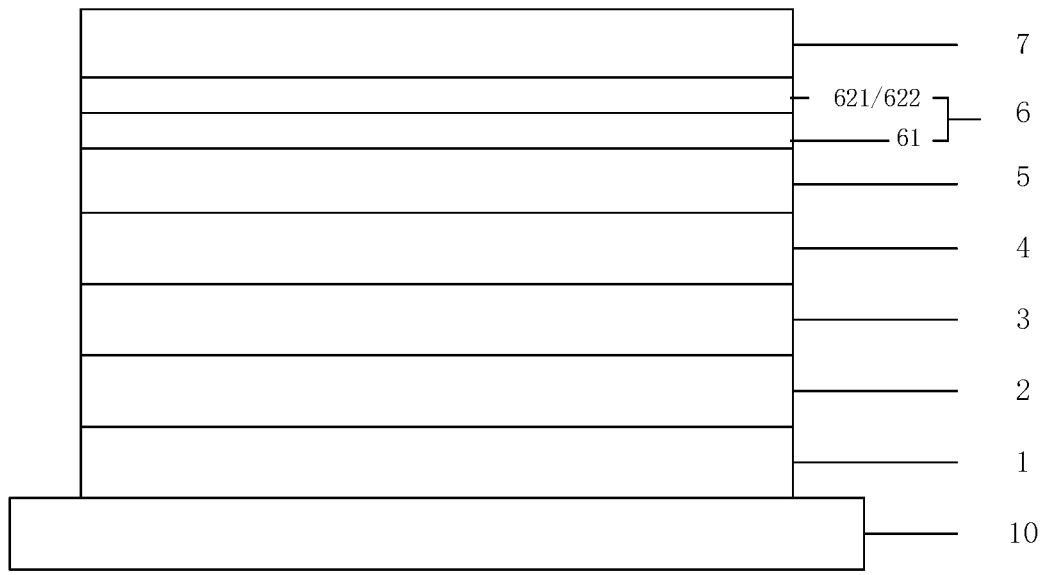
FIG. 3 illustrates a schematic structural diagram of one light-emitting diode having a non-inverted architecture.

For example, as shown in FIG. 3, in some embodiments of the LED having the non-inverted architecture, the LED includes a substrate 10, a hole injection layer 2 arranged on the surface of the substrate 10, a hole transport layer 3 arranged on the surface of the hole injection layer 2, an electron transport layer 5 arranged on the surface of the hole transport layer 3, a luminescent layer 4 arranged on the surface of the hole transport layer 3, a composite film 6 arranged on the surface of the electron transport layer 5, and a cathode 7 arranged on a surface of the composite film 6. The composite film 6 includes an aluminum oxide film 61 arranged adjacent to the electron transport layer and a nano metal oxide film 621 or a silicon nitride film 622 arranged away from the electron transport layer 5.

In one embodiment, the light-emitting diode having the inverted architecture includes an anode 1 and a cathode 7 which are arranged opposite to each other, a luminescent layer 4 arranged between the anode 1 and the cathode 7, an electron transport layer 5 arranged between the cathode 7 and the luminescent layer 4, and a composite film 6 arranged between the cathode 7 and the electron transport layer 5. Where the composite film 6 includes an aluminum oxide film 61 arranged adjacent to the electron transport layer and a nano metal oxide film 62 or a silicon nitride film 622 arranged away from the electron transport layer 5, and the cathode 7 is arranged on the substrate 10. Furthermore, a hole functional layer such as a hole transport layer, a hole injection layer and an electron barrier layer may be arranged between the anode 1 and the luminescent layer 4.

Figure 4:
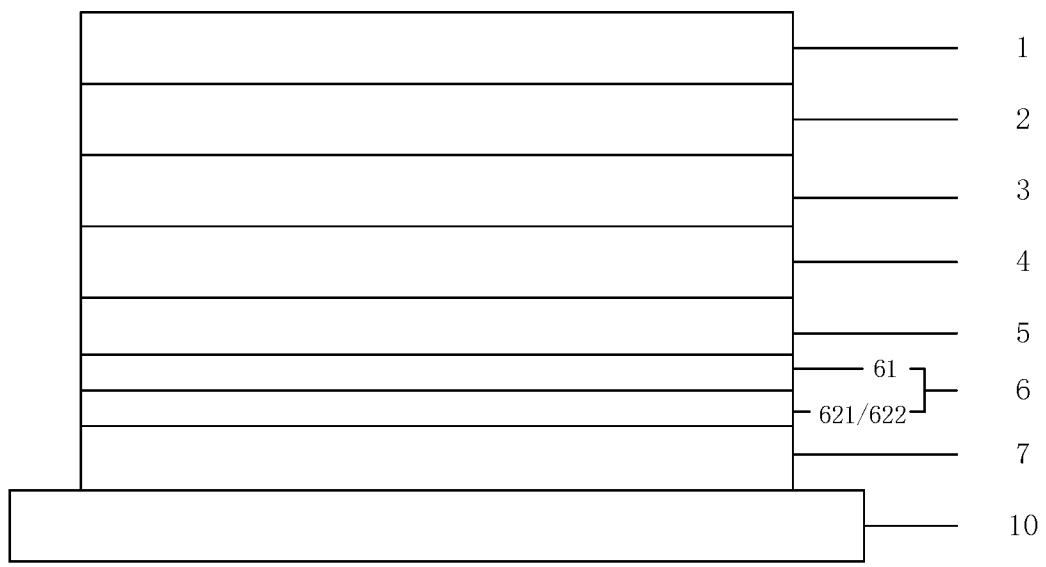
FIG. 4 illustrates a schematic structural diagram of another light-emitting diode having a non-inverted architecture.

For example, as shown in FIG. 4, in some embodiments of the LED having the inverted architecture, the LED includes a substrate 10, a cathode 7 arranged on a surface of the substrate 10, a composite film 6 arranged on a surface of the cathode 7, a luminescent layer 4 arranged on a surface of the composite film 6, a hole transport layer 3 arranged on a surface of the luminescent layer 4, a hole injection layer 3 arranged on the surface of the hole transport layer 3, and an anode 1 arranged on a surface of the hole injection layer 2.

In some embodiments, the luminescent layer 4 is a quantum dot luminescent layer or an organic luminescent layer. The LED provided in the embodiments of the present application may be classified into an organic LED and a QLED (Quantum Dot Light Emitting Diode) according to the types of the luminescent materials.

In the embodiments described above, the substrate 10 may include a rigid substrate such as glass, silicon wafer, metal foil, or include a flexible substrate such as one or the combination of multiple of polyimide, polycarbonate, polystyrene, polyethylene, polyvinyl chloride, polyvinylpyrrolidone, polymethyl methacrylate, polyethylene terephthalate, polyethylene naphthalate, polyamide and polyethersulfone.

The anode 1 may be made of a commonly used anode material and has a common thickness, and the anode material is not limited in the embodiments of the present application. In some embodiments, the anode material is selected from indium-doped tin oxide.

The material of the hole injection layer 2 may be selected from the materials having good hole injection properties. In some embodiments, the material of the hole injection layer 2 includes poly (3,4-ethylenedioxy thiophene)-poly (styrene sulfonic acid) (PEDOT:PSS) and derivatives (PEDOT:PSS: s-MoO$_3$) doped with s-MoO$_3$.

The material of the hole transport layer 3 may be selected from conventional hole transport materials. In some embodiments, the material of the hole transport layer 3 includes poly [(9,9-dioctyl fluorenyl-2,7-diyl)-co-(4,4'-(N-(p-butylphenyl)) diphenylamine)] (TFB), poly (9-vinyl carba-zole) (PVK), poly (N,N'bis (4-butyl phenyl)-N,N'-bis (phenyl) benzidine) (Poly-TPD), N,N'-diphenyl-N,N'-(1-naphthyl)-1,1'-biphenyl-4,4'-diamidogen (NPB).

When the LED is an organic light-emitting diode, the material of the luminescent layer 4 is an organic luminescent material.

When the LED is QLED, the material of the luminescent layer 4 is the quantum dot, the water-oxygen barrier property of the LED is improved by introducing the composite film 6, so that the stability of the LED device may be improved more effectively.

The quantum dot of the quantum dot luminescent layer is a direct bandgap compound semiconductor having light-emitting capability, and the conventional quantum dot material may be selected according to the conventional quantum dot type. For example, the quantum dots of the quantum dot luminescent layer may be one or more of the compounds in Group II-VI, the compounds in Group III-V, and the compounds in Group II-IV-VI. Furthermore, the quantum dot may be a single-component quantum dot or be a quantum dot having core-shell structure, or be at least one of an quantum dot having alloy structure, organic-inorganic hybrid perovskite quantum dot and an all-inorganic quantum dot material. For example, the quantum dots formed by the compounds in the Group II-VI include but are not limited to CdSe, CdS, ZnSe, CdS, PbS, PbSe. The quantum dots formed by the compounds in the Group III-V include but are not limited to InP, InAs; the quantum dots formed by the compounds in the Group II-IV-VI include but are not limited to CuInS$_2$, AgInS$_2$.

The material of the electron transport layer 5 may be made of the conventional electron transport material. In some embodiments, the material of the electron transport layer 5 includes ZnO, aluminum-doped zinc oxide, lithium-doped zinc oxide and magnesium-doped zinc oxide.

The composition of the composite film 6 and the selection of the materials of the composite film 6 are described above, the details of the composition and the materials of the composite film 6 are not repeatedly described herein in order to save space.

In this embodiment of the present application, the cathode 7 may be made of commonly used cathode materials and has common thickness, the cathode materials and the thickness of the cathode 7 are not limited herein. In some embodiments, the material of the cathode 7 includes aluminum and silver. According to the aluminum or the silver serving as the cathode material, and the arrangement of the composite film 6, the formed LED has a good stability (especially good water-oxygen stability).

The LED having the non-inverted architecture according to the embodiments of the present application may be prepared by the method described below:

According to the second aspect, a method for preparing an LED (Light Emitting diode) is provided in the embodiments of the present application, this method includes the following steps:

At step S10, a prefabricated member is provided, where the prefabricated member includes an anode substrate, and a luminescent layer arranged on an anode surface of the anode substrate.

In this embodiment of the present application, the prefabricated member is a local component which has been provided with the anode substrate and the prepared luminescent layer. In some embodiments, the prefabricated member further includes a hole functional layer arranged between the anode and the luminescent layer. The hole functional layer includes at least one of a hole injection layer, a hole transport layer, and an electron barrier layer.

In this embodiment of this application, the preparation of the prefabricated member is not strictly limited, the prefabricated member may be prepared using a conventional method. In some embodiments, a method for preparing the prefabricated member includes: preparing the hole injection layer on the anode substrate, preparing the hole transport layer on the hole injection layer, and preparing the luminescent layer on the hole transport layer to form the prefabricated member.

In the prefabricated member, the selection of each layer of material of the prefabricated member is described above, the details of the selection of the material for each layer of the prefabricated member are not repeatedly described herein in order to save space.

At step S20, an electron transport material is formed on a surface of the luminescent layer 4 being away from the anode substrate, and an annealing treatment is performed on the electron transport material to prepare the electron transport layer 5.

In some embodiments, the electron transport material is formed on the surface of the luminescent layer 4 being away from the anode substrate through a solution processing method, and the electron transport material is annealed to form a film, so that the electron transport layer is prepared. The compactness of the electron transport layer may be improved through the annealing treatment. In some embodiments, the temperature for the annealing treatment is between 30° C. and 120° C. In this condition, the film formed by the electron transport material may generate a certain passivation effect as the temperature increases during the annealing treatment, so that a water-oxygen attachment property of the electron transport material is gradually weakened, and an ageing time of the formed LED is lengthened or delayed. In some embodiments, the temperature for the annealing treatment is between 30° C. and 50° C. In this condition, the temperature for the annealing treatment is controlled at a lower temperature level, the degree of aging of the electron transport material is controlled at a suitable level, so that the level of oxidation between the electron transport layer and the cathode interface is reduced, positive aging enables a better performance of the LED, and a service lifetime of the LED is improved. On this basis, the LED is provided with higher external quantum efficiency through low-temperature annealing treatment. On this basis, the LED has a better external quantum efficiency and a extremely strong stability according to the arrangement of the composite film and the packaging of the LED.

At step S30, an aluminum oxide film is coated on a surface of the electron transport layer being away from the luminescent layer 4, and a nano metal oxide film or a silicon nitride film is coated on a surface of the aluminum oxide film being away from the electron transport layer 5, so that the composite film 6 is formed.

In some embodiments, the aluminum oxide film, the nano metal oxide film and the silicon nitride film are prepared through a PEALD (Plasma Enhanced Atomic Layer Deposition) method. In this condition, the composite film 6 may be prepared through a stable and low-temperature PEALD method without destroying the structure of the LED device. Especially when the electron transport layer is prepared through the low-temperature annealing treatment, the influence of high temperature on the electron transport layer may be avoided, and the degree of ageing of the electron transport material during low-temperature annealing is maintained.

At step S40, a cathode 7 is prepared on a surface of the composite film 6 being away from the electron transport layer, so that an LED is formed.

In some embodiments, the cathode 7 is prepared on the surface of the composite film 6 being away from the electron transport layer 5 through an evaporation treatment.

Furthermore, the formed LED may also be packaged.

According to the preparation method of the LED in the embodiments of the present application, it only needs to prepare the composite film 6 formed by the aluminum oxide film and the nano metal oxide film or prepare the composite film 6 formed by the aluminum oxide film and the silicon nitride film between the electron transport layer 5 and the cathode 7 on the basis of the conventional preparation method of the LED, and enable the aluminum oxide film to be arranged adjacent to the electron transport layer 5. This method is simple to be operated and is mature in process, and has a broad application prospect.

The present application is described below with reference to specific embodiments.

First Embodiment

A QLED (Quantum Dot Light Emitting Diode) having an non-inverted architecture is prepared according to a method described below:
  spin-coating PEDOT: PSS on an ITO (Indium Tin Oxide) substrate, and performing an annealing treatment in air to prepare a hole injection layer having a thickness of 30 nm;
  spin-coating PVK (Polyvinylcarbazole) on the hole injection layer in a nitrogen atmosphere, and performing the annealing treatment at 140° C. to prepare a hole transport layer having a thickness of 20 nm;
  spin-coating a CdSe@ZnS quantum dot on the hole transport layer to prepare a quantum dot luminescent layer having a thickness of 40 nm;
  spin-coating MZO (Magnesium-doped Zinc Oxide) on the quantum dot luminescent layer, and performing annealing treatment at a temperature of 90° C. for 30 minutes to prepare an electron transport layer having a thickness of 50 nm;
  sequentially depositing $Al_2O_3$ film having a thickness of 10 nm and depositing $TiO_2$ film on the electron transport layer in a PEALD (Plasma Enhanced Atomic Layer Deposition) method to prepare a composite film 6;
  evaporating an aluminum electrode having a thickness of 85 nm on the composite film 6; and
  obtaining the quantum dot light-emitting diode device after encapsulation.

Second Embodiment

The second embodiment differs from the first embodiment in that the $TiO_2$ film having the thickness of 10 nm is replaced with a $ZrO_2$ film having a thickness of 10 nm.

Third Embodiment

The third embodiment differs from the first embodiment in that the $TiO_2$ film having the thickness of 10 nm is replaced with a $SiO_2$ film having a thickness of 10 nm.

Fourth Embodiment

The fourth embodiment differs from the first embodiment in that the $TiO_2$ film having the thickness of 10 nm is replaced with a $SiN_4$ film having a thickness of 10 nm.

Fifth Embodiment

The fifth embodiment differs from the first embodiment in that the annealing temperature is adjusted to be 40° C. from 90° C. in the step of "spin-coating MZO on the quantum dot luminescent layer, and performing annealing treatment at a temperature of 90° C. for 30 minutes".

First Comparative Example

The first comparative example differs from the first embodiment in that the step of "sequentially depositing $Al_2O_3$ film having a thickness of 10 nm and depositing $TiO_2$ film on the electron transport layer 5 in a PEALD (Plasma Enhanced Atomic Layer Deposition) method to prepare a composite film 6" is canceled, and a step of evaporating an Aluminum electrode having a thickness of 85 nm on the composite film 6 is directly added after the electron transport layer 5 is annealed.

Second Comparative Example

The second comparative example differs from the first embodiment in that the step of "sequentially depositing $Al_2O_3$ film having a thickness of 10 nm and depositing $TiO_2$ film on the electron transport layer 5 in a PEALD (Plasma Enhanced Atomic Layer Deposition) method to prepare a composite film" in the first embodiment is adjusted as "depositing a $Al_2O_3$ film having a thickness of 20 nm on the electron transport layer 5 through the PEALD method".

The quantum dot light-emitting diode devices prepared in the first embodiment, the second embodiment, the third embodiment, the fourth embodiment, the fifth embodiment, the first comparative example and the second comparative example are placed in a constant-humidity and constant-temperature environment with a relative humidity of 80% and a temperature of 40° C., a brightness-voltage-current test and a lifetime test are performed every seven days, and external quantum efficiencies and QLED device's service lifetime values each time are observed. The results are shown in Table 1 below:

TABLE 1

| | sample | | | | | | | |
|---|---|---|---|---|---|---|---|---|
| | first embodiment | | second embodiment | | third embodiment | | fourth embodiment | |
| time | external quantum efficiency (%) | LT95 @1 knit (hrs) | external quantum efficiency (%) | LT95@1 knit (hrs) | external quantum efficiency (%) | LT95@1 knit (hrs) | external quantum efficiency (%) | LT95@1 knit (hrs) |
| Day 1 | 11.18 | 667.30 | 7.94 | 522.81 | 8.86 | 349.44 | 5.59 | 104.86 |
| Day 8 | 12.35 | 765.72 | 8.03 | 441.87 | 8.53 | 375.87 | 6.77 | 111.47 |
| Day 15 | 12.10 | 649.44 | 7.79 | 580.27 | 9.10 | 302.41 | 6.69 | 232.11 |
| Day 22 | 12.49 | 605.54 | 8.20 | 559.63 | 9.27 | 401.33 | 7.01 | 283.27 |

| | sample | | | | | |
|---|---|---|---|---|---|---|
| | fifth embodiment | | first comparative example | | second comparative example | |
| time | external quantum efficiency (%) | LT95 @1 knit (hrs) | external quantum efficiency (%) | LT95@1 knit (hrs) | external quantum efficiency (%) | LT95@1 knit (hrs) |
| Day 1 | 18.86 | 979.92 | 11.48 | 849.79 | 10.74 | 531.59 |
| Day 8 | 19.80 | 836.69 | 14.52 | 1499.42 | 17.68 | 781.33 |
| Day 15 | 20.19 | 1130.85 | 12.61 | 686.76 | 22.21 | 1272.23 |
| Day 22 | 20.70 | 1093.90 | 7.30 | 98.05 | 22.40 | 1623.81 |

As can be seen from the table 1 listed above, compared with the first comparative example, the external quantum efficiencies and the stability of lifetime of the quantum dot light-emitting diodes provided in the first embodiment, the second embodiment, the third embodiment, the fourth embodiment and the fifth embodiment of the present application are greatly improved after these devices are stored for 22 days in a constant-humidity and constant-temperature environment of a relative humidity of 80% and a temperature of 40° C. (from day 1 to day 22, and the external quantum efficiency rises not more than 2%). This may be due to the fact that the composite film 6 is not provided in the first comparative example, so that the LED device firstly enters an active aging state (external quantum efficiency is increased rapidly and the lifetime is prolonged) in the constant-humidity and constant-temperature environment with a relative humidity of 80% and a temperature of 40° C., and then rapidly enters a negative aging state (the external quantum efficiency is rapidly quenched and the lifetime is reduced). However, the composite film formed by the aluminum oxide film and the nano metal oxide film is arranged between the electron transport layer 5 and the cathode 7 in the quantum dot light-emitting diodes provided in the first embodiment, the second embodiment, the third embodiment, the fourth embodiment and the fifth embodiment, so that the stability of the LED in the water-oxygen environment under the constant-humidity and constant-temperature environment with the relative humidity of 80% and the temperature of 40° C. is improved. However, there is a greater conduction band of the nano metal oxide material in the second embodiment, the third embodiment and the fourth embodiment (titanium oxide also has a conduction band of 3.2 eV), so that the electrical properties of the QLED is affected to a certain extent.

As compared to the second comparative example, there are more stable external quantum efficiency and service lifetime of the QLED provided in the first embodiment of the present application after the QLED is stored for 22 days in the constant-humidity and constant-temperature environment with a relative humidity of 80% and a temperature of 40° C. This may be due to the fact that in the QLED provided in the first embodiment of the present application, the composite film 6 arranged between the electron transport layer 5 and the cathode 7 contains the nano metal oxide film which improves the crystallization of the aluminum oxide film, thereby significantly improving the stability of the LED in the water-oxygen environment. Alumina is used individually as a transition layer film in the second comparative example, although the external quantum efficiency and device's service lifetime are relatively higher, the fluctuation of the external quantum efficiency is significant, this is because that the active aging speed is too fast (this is not desirable). After the luminescent efficiency of the LED device is rapidly improved due to vigorous positive aging efficiency, the LED device will enter a degeneration period quickly, and the external quantum efficiency and the service lifetime of the LED device are degenerated very fast, and the stability of the LED device becomes weakened.

Comparing the first embodiment with the fifth embodiment in the present application, the annealing temperature of the electron transport layer is reduced, and the positive aging speed is decelerated in the fifth embodiment, so that the "passivation" effect of the zinc oxide layer is weakened, and the electrical properties of the LED device is improved while the stability of the LED device is ensured in the fifth embodiment.

The foregoing embodiments are only some preferable embodiments of the present application, and should not be regarded as limitations to the present application. All modifications, equivalent replacements, and improvements, which are made within the spirit and the principle of the present application, should all be included in the protection scope of the present application.

What is claimed is:

1. A light-emitting diode, comprising: an anode and a cathode which are arranged opposite to each other, a luminescent layer arranged between the anode and the cathode, an electron transport layer arranged between the cathode and the luminescent layer, and a composite film arranged between the cathode and the electron transport layer, wherein the composite film comprises an aluminum oxide film arranged adjacent to the electron transport layer, and a nano metal oxide film or a silicon nitride film arranged away from the electron transport layer;
   wherein a material of the nano metal oxide film comprises at least one of $TiO_2$, $ZrO_2$, and $SiO_2$, and a material of the electron transport layer comprises ZnO, Aluminum-doped zinc oxide, lithium-doped zinc oxide and magnesium-doped zinc oxide.

2. The light-emitting diode according to claim 1, wherein a thickness of the composite film is less than or equal to 25 nm.

3. The light-emitting diode according to claim 2, wherein the thickness of the composite film is between 15 nm and 25 nm.

4. The light-emitting diode according to claim 2, wherein when the composite film comprises the nano metal oxide film, a thickness ratio of the aluminum oxide film to the nano metal oxide film is between 3:1 and 1:3.

5. The light-emitting diode according to claim 3, wherein a thickness ratio of the aluminum oxide film to the nano metal oxide film is one of 1:3, 1:2, 1:1, 2:1 and 3:1.

6. The light-emitting diode according to claim 2, wherein a thickness ratio of the aluminum oxide film to the silicon nitride film is between 3:1 and 1:3.

7. The light-emitting diode according to claim 6, wherein a thickness ratio of the aluminum oxide film to the silicon nitride film is one of 1:3, 1:2, 1:1, 2:1 and 3:1.

8. The light-emitting diode according to claim 1, further comprising a hole functional layer arranged between the anode and the luminescent layer.

9. The light-emitting diode according to claim 8, wherein the hole functional layer comprises at least one of a hole injection layer, a hole transmission layer and a hole barrier layer.

10. The light-emitting diode according to claim 1, wherein the light-emitting diode has a non-inverted architecture, the light-emitting diode further comprises a substrate and the anode is arranged on the substrate.

11. The light-emitting diode according to claim 1, wherein the luminescent layer is a quantum dot luminescent layer or an organic luminescent layer.

12. A method for preparing a light-emitting diode, comprising following steps of:
    providing a prefabricated member, wherein the prefabricated member comprises an anode substrate, and a luminescent layer arranged on an anode surface of the anode substrate;
    forming an electron transport material on a surface of the luminescent layer being away from the anode substrate, and performing an annealing treatment on the electron transport material to prepare an electron transport layer;
    coating an aluminum oxide film on a surface of the electron transport layer being away from the luminescent layer, and coating a nano metal oxide film or a silicon nitride film on a surface of the aluminum oxide film being away from the electron transport layer to form a composite film, wherein a material of the nano metal oxide film comprises at least one of $TiQ_2$, $ZrO_2$, and $SiO_2$; and
    preparing a cathode on a surface of the composite film being away from the electron transport layer to form the light-emitting diode, wherein a material of the electron transport layer comprises ZnO, Aluminum-doped zinc oxide, lithium-doped zinc oxide and magnesium-doped zinc oxide.

13. The method for preparing the light-emitting diode according to claim 12, wherein an annealing temperature for the annealing treatment is between 30° C. and 120° C.

14. The method for preparing the light-emitting diode according to claim 13, wherein the annealing temperature for the annealing treatment is between 30° C. and 50° C.

* * * * *